(12) United States Patent
Ko et al.

(10) Patent No.: US 10,952,313 B1
(45) Date of Patent: Mar. 16, 2021

(54) VIA IMPEDANCE MATCHING

(71) Applicant: Arista Networks, Inc., Santa Clara, CA (US)

(72) Inventors: Theophilus Ko, Vancouver (CA); Pranav Devalla, San Jose, CA (US); Jim Weaver, Santa Clara, CA (US)

(73) Assignee: ARISTA NETWORKS, INC., Santa Clara, CA (US)

( * ) Notice: Subject to any disclaimer, the term of this patent is extended or adjusted under 35 U.S.C. 154(b) by 0 days.

(21) Appl. No.: 16/749,901

(22) Filed: Jan. 22, 2020

(51) Int. Cl.
*H05K 1/02* (2006.01)
*H01L 23/498* (2006.01)
*H01L 23/64* (2006.01)
*H01L 23/58* (2006.01)
*H05K 1/14* (2006.01)
*H05K 1/18* (2006.01)
*H05K 3/40* (2006.01)
*H05K 3/46* (2006.01)
*H05K 3/42* (2006.01)
*H05K 1/11* (2006.01)

(52) U.S. Cl.
CPC ....... *H05K 1/025* (2013.01); *H01L 23/49822* (2013.01); *H01L 23/49827* (2013.01); *H01L 23/585* (2013.01); *H01L 23/642* (2013.01); *H05K 1/113* (2013.01); *H05K 1/144* (2013.01); *H05K 1/181* (2013.01); *H05K 3/4007* (2013.01); *H05K 3/42* (2013.01); *H05K 3/4644* (2013.01); *H05K 2201/0776* (2013.01)

(58) Field of Classification Search
CPC ...... H05K 1/025; H05K 3/4644; H05K 1/181; H05K 3/42; H05K 1/113; H05K 2201/0776; H01L 23/642; H01L 23/49827; H01L 23/49822; H01L 23/585
USPC ......................................................... 361/767
See application file for complete search history.

(56) References Cited

U.S. PATENT DOCUMENTS

| | | | |
|---|---|---|---|
| 8,866,563 B1 * | 10/2014 | Ben Artsi | H03H 7/38 333/34 |
| 2005/0029013 A1 * | 2/2005 | Lee | H05K 1/0251 174/262 |
| 2005/0146390 A1 * | 7/2005 | Baek | H05K 1/0251 333/33 |
| 2005/0190614 A1 * | 9/2005 | Brunette | H05K 1/0222 365/192 |
| 2007/0018752 A1 * | 1/2007 | Miller | H01P 1/047 333/33 |
| 2010/0282503 A1 * | 11/2010 | Kushta | H05K 1/0251 174/266 |
| 2010/0314163 A1 * | 12/2010 | Twardy | H05K 1/0268 174/266 |

* cited by examiner

*Primary Examiner* — Sherman Ng
(74) *Attorney, Agent, or Firm* — Fountainhead Law Group P.C.

(57) ABSTRACT

An electronic circuit includes a first conductor configured horizontally on a first layer and a second conductor configured horizontally on a second layer. The second conductor is separated from the first conductor by a plurality of layers. A third conductor is configured between the first layer and the second layer. The third conductor electrically couples the first conductor and the second conductor. One or more intermediate conductors are electrically coupled to the third conductor, with the one or more intermediate conductors configured on one or more intermediate layers between the first layer and the second layer.

24 Claims, 14 Drawing Sheets

VIA IMPEDANCE MATCHING

BACKGROUND

The present disclosure relates to generally to vias in printed circuit boards for electrically coupling electrical signals between conductive layers of the printed circuit boards.

Printed circuit boards, as well as integrated circuits, include vias for electrically connecting conductive layers in the printed circuit to allow for electrical signals to be communicated between these conductive layers. An electrical signal must propagate or transition from a first conductive layer through a via to one or more other conductive layers in the PCB. For example, in a ball grid array (BGA) package, connection pads on the package, each of which has a solder ball attached thereto, are attached to corresponding connection pads on a PCB. Electrical signals from a circuit in the BGA package are provided on respective connection pads, and these electrical signals must transition through vias in the PCB to multiple conductive layers of the PCB. An electrical signal transitioning through a via must have a low magnitude of reflection or low return loss to minimize errors in the signal. The return loss is the loss of power in a signal that results from a portion of that signal being returned or reflected back towards a source of the signal due to impedance discontinuities in a signal path over which the signal is being communicated. As Nyquist sampling frequencies go higher in modern circuits, such as high-speed switching circuits in datacenters, the return loss of electrical signals must be lower over a larger frequency range to achieve adequate performance. For example, emerging 112G PAM4 standards will increase the Nyquist frequency from the 13.281 GHz currently employed to 26.5625 GHz. The via transition between the connection pad on the BGA package and the conductive layer in the BGA causes an impedance mismatch, which increases the return loss of the signal transitioning through the via.

The present disclosure is directed to vias in PCBs or integrated circuits having reduced return loss at frequencies of interest.

SUMMARY

The following detailed description and accompanying drawings provide a better understanding of the nature and advantages of the present disclosure.

DETAILED DESCRIPTION

In the present description, for purposes of explanation, numerous examples and specific details are set forth in order to provide a thorough understanding of the present disclosure. Such examples and details are not to be construed as unduly limiting the elements of the claims or the claimed subject matter as a whole. It will be evident to one skilled in the art, based on the language of the different claims, that the claimed subject matter may include some or all of the features in these examples, alone or in combination, and may further include modifications and equivalents of the features and techniques described herein.

Figure 1:
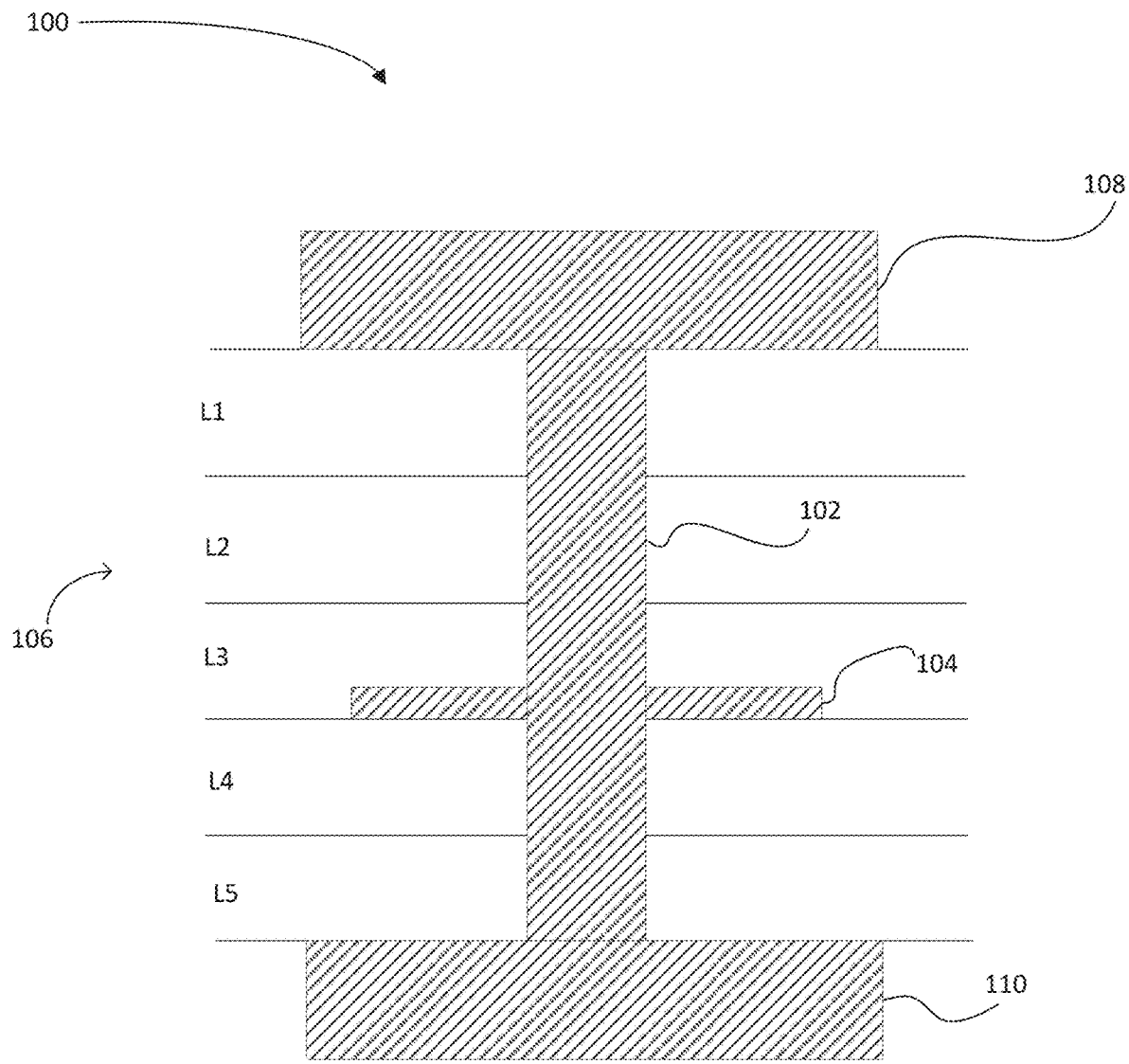
FIG. 1 is a cross-sectional view of an electronic circuit including a via and one or more intermediate conductors coupled to the via to improve the frequency response across the via according to one embodiment of the present disclosure.

FIG. 1 is a cross-sectional view of an electronic circuit 100 including a conductor 102 configured between a first layer L1 and a second layer L2 to electrically couple a first conductor 108 and a second conductor 110. One or more intermediate conductors 104 coupled to conductor 102 to improve the frequency response of conductor 102 at a frequency or frequency range of interest according to one embodiment of the present disclosure.

Figure 18:
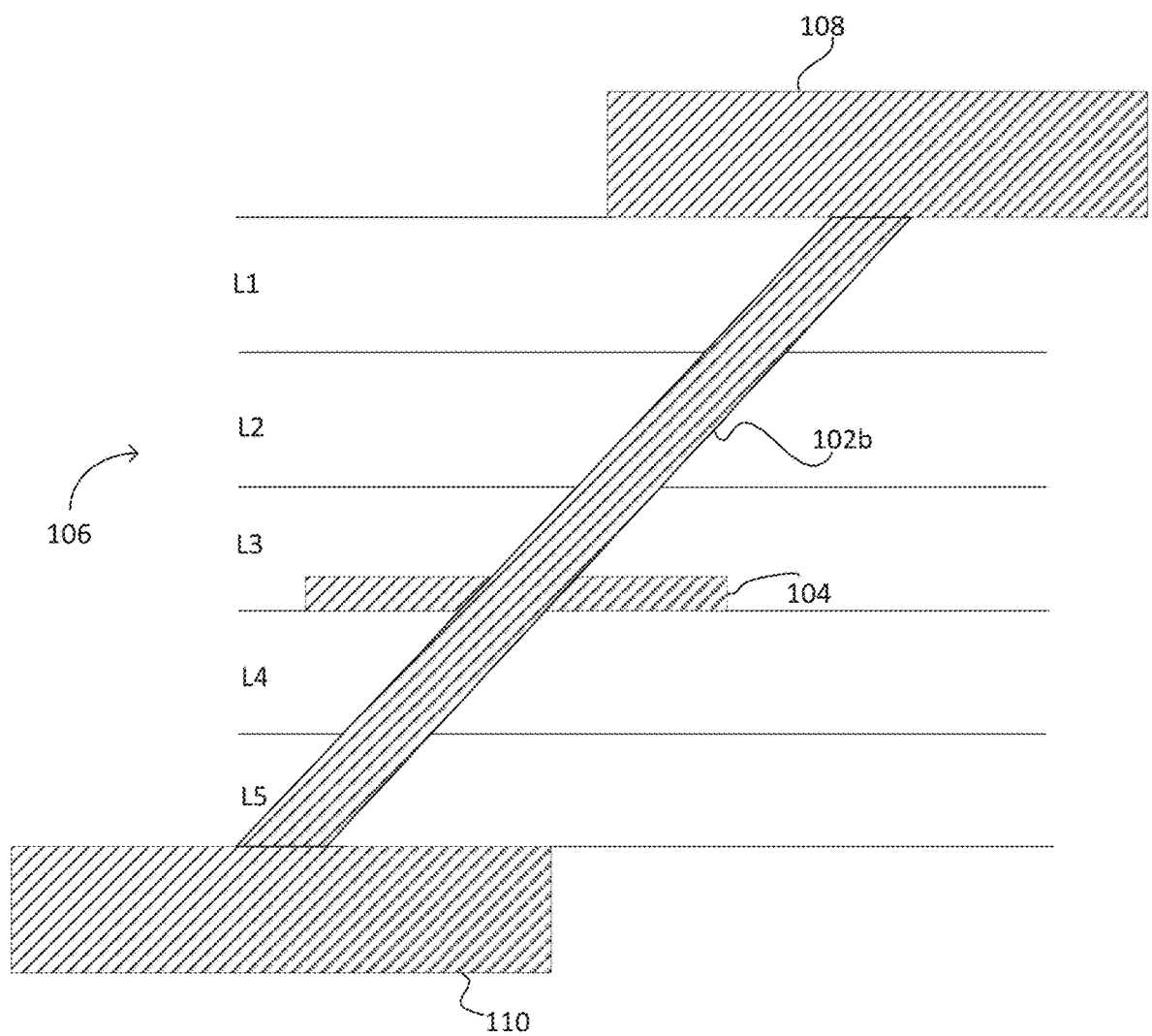
FIG. 18 illustrates another embodiment of the present disclosure.

For purposes of illustration, FIG. 1 shall be described in the context of an example where conductor 102 is a via and conductors 108 and 110 are conductors (e.g., pads) on layers of a printed circuit board (PCB) 106. In this example, via 102 extends through multiple layers L1-L5 of a substrate. The PCB 106 may include additional layers, which are not shown in FIG. 1. A first conductor 108 is configured (e.g., horizontally) on first layer L1 and a second conductor 110 configured (e.g., horizontally) on layer L5, with the via 102 extending between the first and second conductors. In this example, via 102 is vertical, but in other embodiments the via may not be vertical (e.g., See FIG. 18 described below). The second conductor 110 is separated from the first conductor 108 by the plurality of layers L1-L5. In this example, one or more intermediate conductors 104 are configured on intermediate layers between layers L1 and L5, and may be coupled to the via 102 between the first conductor 108 and the second conductor 110. In this example, the second conductor 110 is vertically below the first conductor 108 and the intermediate conductors 104 are horizontal. However, in other embodiments the first and second conductors may not be overlapping (as illustrated in FIG. 18 below). Similarly, the intermediate conductors on the intermediate layers may not be horizontal in some embodiments. The present example shown in FIG. 1 is, therefore, merely illustrative. In operation, the one or more intermediate conductors 104 are positioned or placed along the via 102 to modify an impedance profile of the via and thereby improve the return loss of the via in a frequency range of interest, as will be described in more detail below.

In one example embodiment, the electronic circuit 100 includes a BGA package and the first conductor 108 corresponds to a conductive pad and solder ball on the BGA package while the second conductor 110 corresponds to a conductive trace coupled to the via 102 and extending on a layer in the PCB 106. A signal propagates across such a via between two pads—one pad coupled to a signal trace and the other pad on the surface of the PCB. One or more intermediate conductors are configured along the length of the via, which results in a reduction in the broadband return loss resulting from the signal propagating through the via. For long vias, which may span many layers of a multilayer PCB, multiple intermediate conductors may be configured along the length of the via to improve the broadband frequency response. Embodiments of the present disclosure may reduce the return loss at frequencies as high as 50 GHz or even higher. For example, embodiments reduce return loss at a frequency of 26 GHz, which may be useful in emerging 112G PAM4 implementations, for example.

The one or more intermediate conductors 104 may be non-functional pads (NFPs) in embodiments of the present disclosure. A NFP may be, for example, a conductive pad (e.g., in a PCB) that surrounds, and may be electrically connected to, a via but is not connected to any other conductive trace on the layer on which the NFP is located. In various embodiments, during the fabrication of a PCB, NFPs may be formed to electrically connect to particular vias in the PCB and thus these NFPs may be utilized to form the one or more intermediate conductors 104. The number of NFPs or other intermediate conductors 104 included along the via 102 may be a function of a vertical height of the via, as will be described in more detail below. As mentioned above, although embodiments of the present disclosure are described as including a via extending vertically between first and second conductors, the present disclosure is not limited to a vertical via for this interconnection. FIG. 18 illustrates a via for connecting conductors that is not vertical. In this example, the via is diagonal between conductors 108 and 110, and the upper and lower conductors may, or may not, overlap, for example.

The inclusion of the NFPs or other intermediate conductors 104 modifies the impedance profile of the via 102 to reduce the return loss of the via at the frequency range of interest. For example, in 112G PAM4 systems, the frequency range of interest is in the 26.5625 GHz region, and the inclusion of the NFP or other intermediate conductors 104 reduces return loss of the via in this frequency range. While the inclusion of the NFP or other intermediate conductors 104 reduces the return loss of the via 102 in the frequency range of interest, the NFP or other intermediate conductor may adversely affect the return loss of the via in other frequency ranges. For example, inclusion of the NFP or other intermediate conductor 104 may reduce return loss in the frequency range around 26.5625 GHz but increase return loss of the via in the frequency range around 14 GHz.

The inclusion of the one or more intermediate conductors 104 may be contrary to typical via optimization approaches, which focus on the capacitive characteristics of the first and second conductors 108, 110 coupled to the via. The goal of such conventional via transition tuning strategies is to keep the impedance of the via as close as possible to an impedance of each of the first conductor 108 and second conductor 110. In contrast, the inclusion of the one more intermediate conductors 104 increases a capacitance along the via between the first conductor 108 and second conductor 110, which may make the impedance of the via 102 lower than the impedance of both the second conductor 110 (e.g., the breakout electrical trace on a layer in PCB 106) and the first conductor 108 (e.g., BGA package conductive pad and solder ball) when viewed in a time domain reflectometry (TDR) graph of the electronic circuit 100. In conventional tuning strategies, such a lower impedance would imply higher return loss and thus worse performance of the structure, but embodiments of the present disclosure provide reduced return loss and improved performance across a range of frequencies of interest, as will be described in more detail below.

Figure 2:
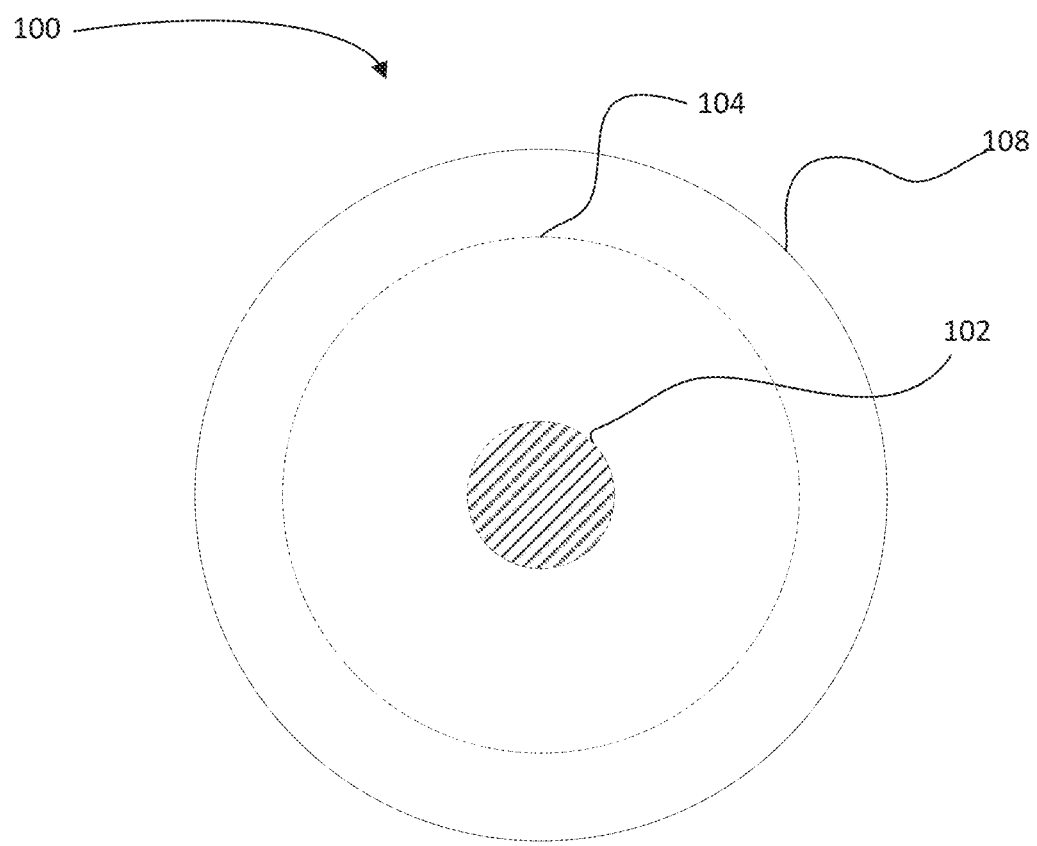
FIG. 2 is a top view of the electronic circuit of FIG. 1 according to one embodiment.

FIG. 2 is a top view of the electronic circuit 110 of FIG. 1 according to one embodiment. Each of the first conductor 108, intermediate conductor 104 and via 102 has a circular horizontal cross-sectional area in this embodiment. In one embodiment, the one or more conductors 104 are positioned (e.g., vertically) along the via 102 between the first conductor 108 and second conductor 110 at intervals that are based on the horizontal cross-sectional areas of the first conductor, the second conductor, and the via. In one embodiment, the PCB 106 has a dielectric constant ε of approximately 3 and the via 102 has a maximum length of approximately 120 mils. In this embodiment, the vertical interval between intermediate conductors 102 is forty (40) mils and thus there are two intermediate conductors 104, a first intermediate conductor 40 mils from the first conductor 108 and a second intermediate conductor 40 mils from the second conductor 110, with there being 40 mils between the two intermediate conductors.

Figure 3:
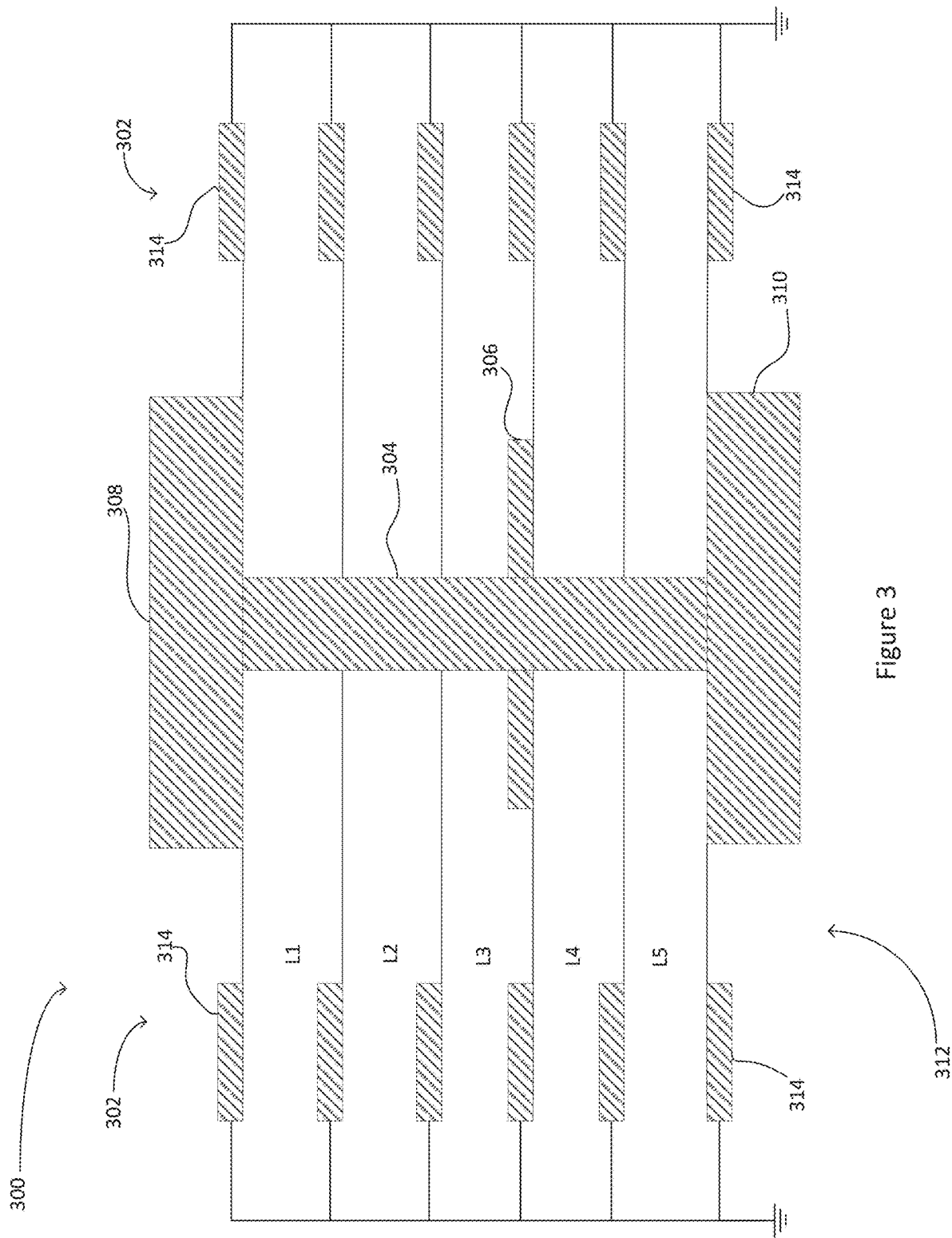
FIG. 3 is a cross-sectional view of an electronic circuit including a ground ring surrounding a via and an intermediate conductor coupled to the via according to another embodiment.

FIG. 3 is a cross-sectional view of an electronic circuit 300 including a ground ring 302 surrounding a via 304 with and an intermediate conductor 306 coupled to the via according to another embodiment. The via 304 extends vertically between a first conductor 308 and a second conductor 310. Each of these components is formed on respective layers of a PCB 312. The PCB 312 has five layers L1-L5 in the example of FIG. 3 just as in the example of FIG. 1. Embodiments of the present disclosure are not limited to five layers for the PCB, with alternative embodiments being implemented in PCBs with more or fewer layers.

The ground ring 302 includes a plurality of conductors 314 coupled to a reference voltage, which is ground in the example embodiment of FIG. 3. The plurality of conductors 314 are generally horizontally adjacent to, and spaced apart from, the one or more intermediate conductors 306. In the embodiment of FIG. 3, the plurality of conductors 314 include conductors on the same layer as, and spaced apart from, the first conductor 308 on the first layer L1, the second conductor 310 on the layer L5, and the via 304 on the plurality of layers L2-L4 between the first layer L1 and the layer L5. More specifically, in the embodiment of FIG. 3, the plurality of conductors 314 of the ground ring 302 include conductors on the same layer L4 as the intermediate conductor 306 (formed on the surface of layer L4) and spaced apart from the intermediate conductor. In other embodiments, the ground ring 302 does not include a conductor 314 formed on the surfaces of every layer of the PCB 312 as in the embodiment FIG. 3. For example, in one embodiment the ground ring 302 includes a conductor 314 formed only on the same layer L4 as, and spaced apart from, the intermediate conductor 306.

In the example embodiment of FIG. 3 the electronic circuit 300 includes one intermediate conductor 306, but embodiments are not limited to only one intermediate conductor. Further embodiments include multiple intermediate conductors 306 coupled to the via 304 at selected locations or intervals. The locations or intervals at which the intermediate conductors 306 may be coupled to the via 304 are limited by the thickness of layers L1-L5 of the PCB 312. This is true because intermediate conductors 306 can be formed on the surfaces of any of the layers L1-L5 but not between the surfaces of a respective layer.

In operation, the intermediate conductor 306 provides additional capacitive coupling to the ground ring 302 at the location of the via 304 at which the intermediate conductor is coupled. This additional capacitive coupling modifies the impedance profile of the via 304 such that the return loss of signal propagating through the via is reduced at a frequency range of interest, as will be explained in more detail below. The intermediate conductor 306 may in some embodiments degrade performance (i.e., increase return loss) of the via 304 at certain frequencies while at the same time improving performance at other frequencies. In other embodiments, the return loss at multiple frequency ranges of interest may be reduced to thereby improve performance at multiple frequency ranges of interest. Accordingly, the intermediate conductor 306 is coupled to the via 304 at a location that improves the return loss of the circuit 300 in a frequency range of interest.

Figure 4:
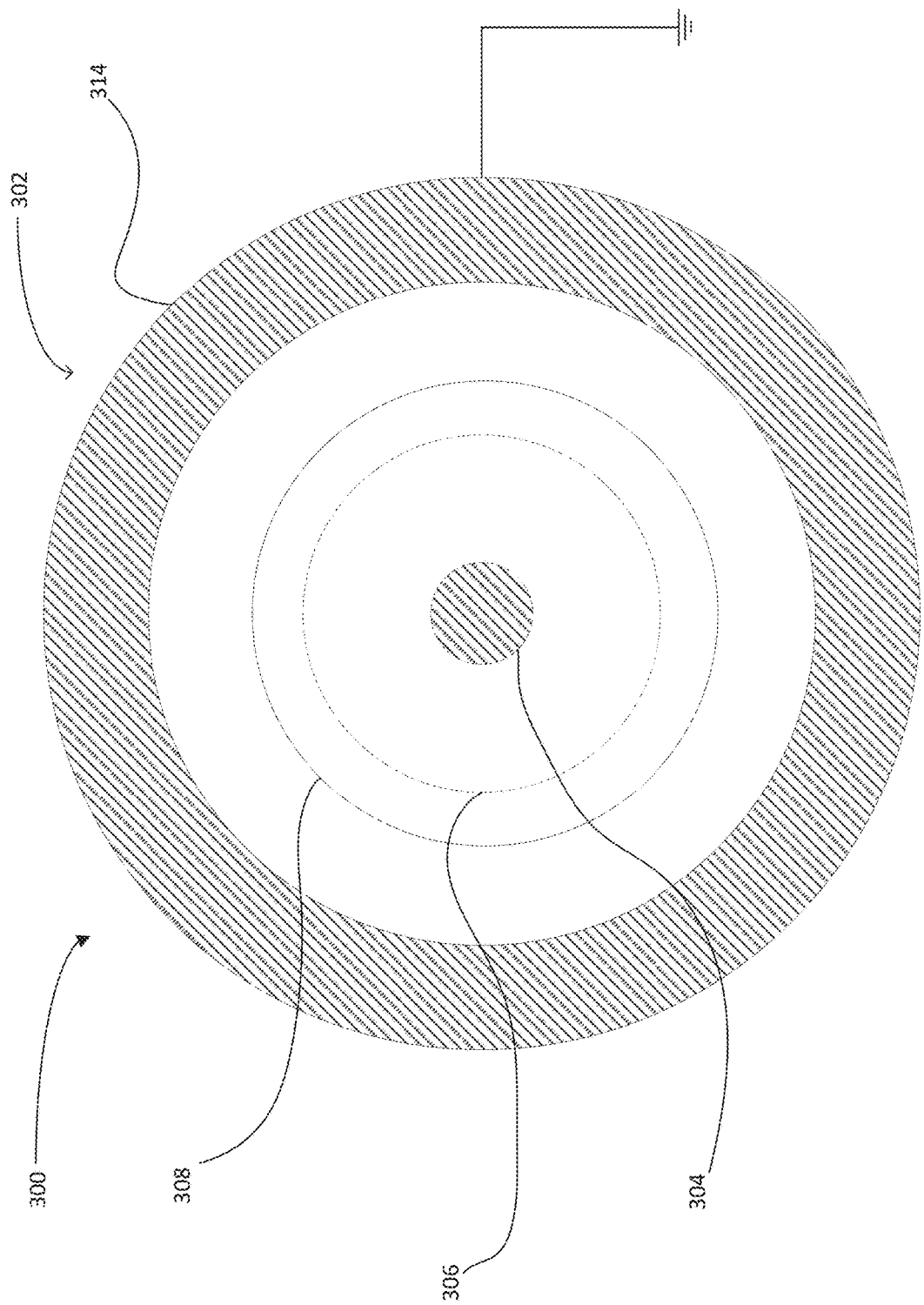
FIG. 4 is a top view of the electronic circuit of FIG. 3 according to an embodiment.

FIG. 4 is a top view of the electronic circuit 300 of FIG. 3 according to an embodiment. The cross-sectional horizontal areas of the via 304, intermediate conductor 306 and first conductor 308 are circular in the embodiment of FIG. 4. The same is true for the ground ring 302 that surrounds the via 304, intermediate conductor 306, the first conductor 308, and the second conductor 310 (not shown in FIG. 4). In one embodiment, the one or more intermediate conductors 306 are configured along the via 304 at intervals based on horizontal distances between the conductors 314 of ground ring 302 and the first conductor 308 on the first layer L1, the second conductor 310 on the layer L5 (FIG. 3), and the one or more intermediate conductors 306. Thus, in the embodiment of FIG. 4 the intervals at which the one or more intermediate conductors 306 are spaced along the via 304 are based on the radial distances between the conductors 314 of the ground ring 302 and the first conductor 308, second conductor 310, and one or more intermediate conductors 306. In another embodiment, the intervals along the via 304 at which the one or more intermediate conductors 306 are coupled are based on horizontal cross-sectional areas of the first conductor 308, the second conductor 310, and the via 304.

Figure 5:
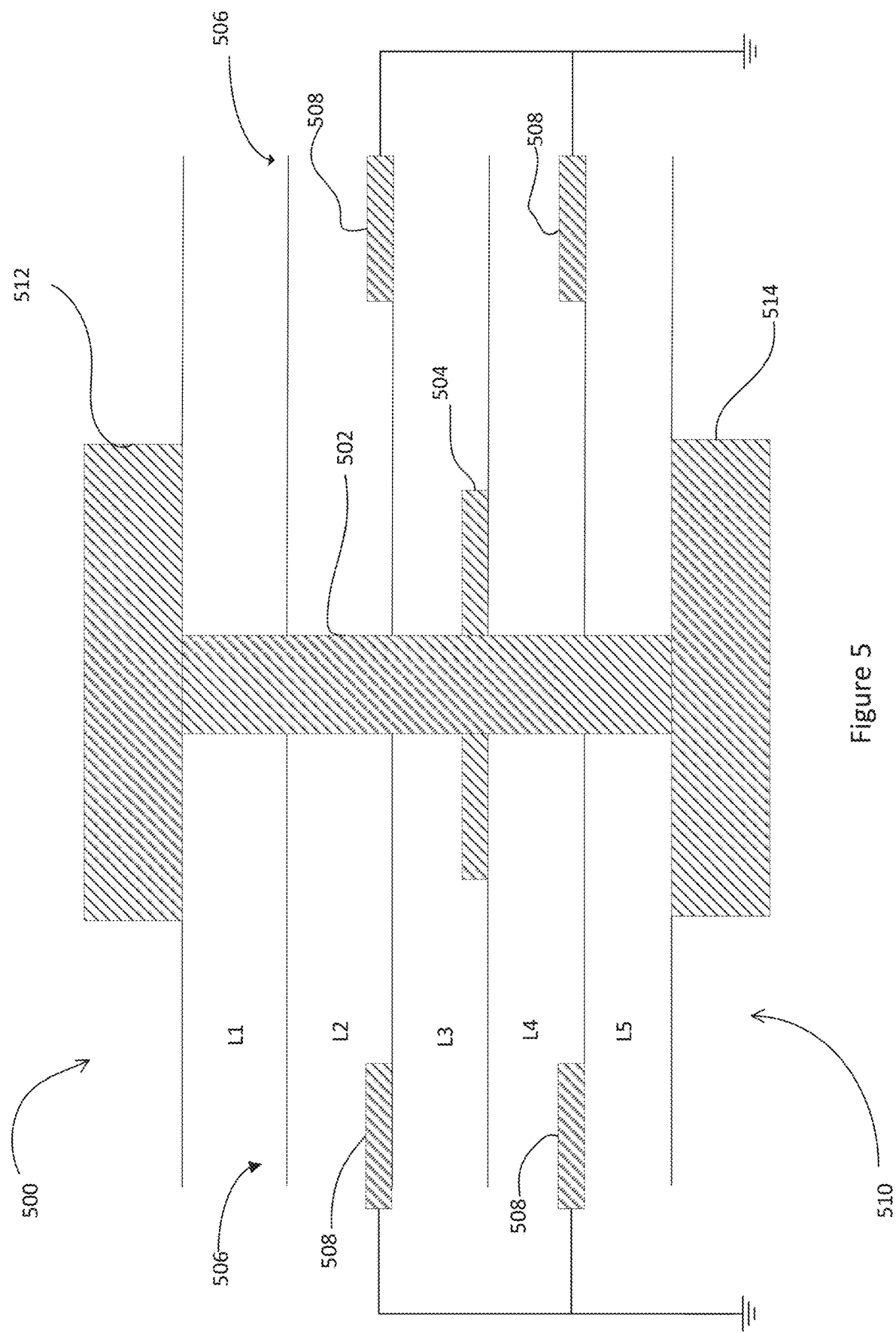
FIG. 5 is a cross-sectional view of an electronic circuit including a via with an intermediate conductor coupled to the via and a ground ring including conductors on layers vertically adjacent the intermediate conductor according to another embodiment.

FIG. 5 is a cross-sectional view of an electronic circuit 500 including a via 502 with an intermediate conductor 504 coupled to the via and a ground ring 506 including conductors 508 on layers L3 and L5 of a PCB 510 that are vertically adjacent layer L3 on which the intermediate conductor is formed according to another embodiment. The via 502 extends between a first conductor 512 on the layer L1 of the PCB 510 and a second conductor 514 on layer L5 of the PCB. Where the electronic circuit 500 includes a BGA package, the first conductor 512 corresponds to a conductive pad and solder ball on the BGA package while the second conductor 514 corresponds to a conductive trace coupled to the via 502 and extending on a layer in the PCB 510. The conductors 508 of the ground ring 506 are coupled to ground in the embodiment of FIG. 5 but may be coupled to another reference voltage plane in other embodiments. The ground ring 506 includes only the two conductors 508, which are positioned on the layers L3 and L5 that are vertically adjacent the layer L4 on which the intermediate conductor 504 is formed.

Figure 6:
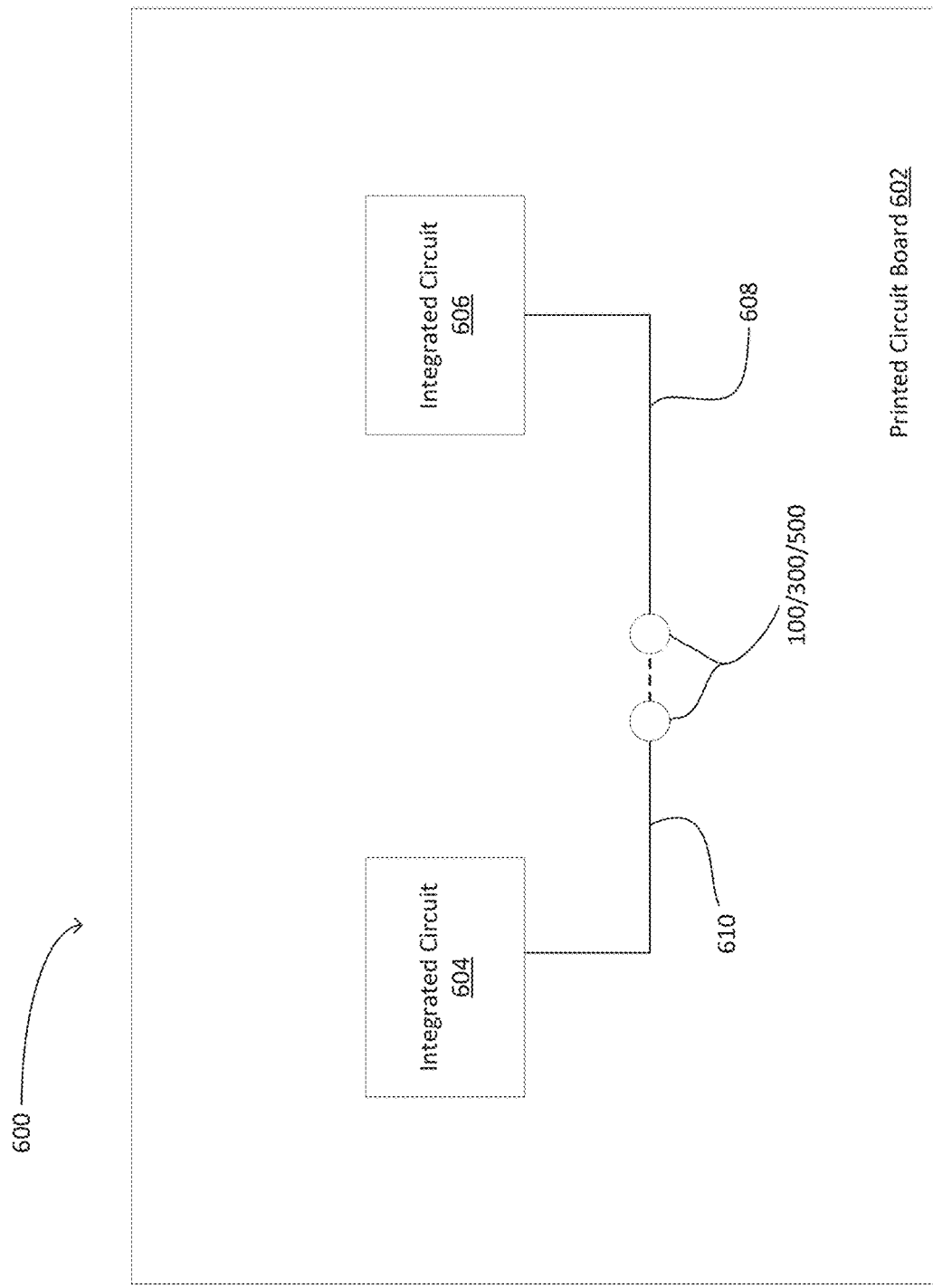
FIG. 6 illustrates an electronic system including a pair of integrated circuits electrically interconnected through one or more of the vias in the electronic circuits of FIGS. 1-5 according to another embodiment.

FIG. 6 illustrates an electronic system 600 including a PCB 602 containing a pair of integrated circuits 604, 606 that are electrically interconnected through one or more of the electronic circuits 100/300/500 as described above with reference to FIGS. 1-5. A conductive trace 608 on a top surface of the PCB 602 is coupled to the integrated circuit 606 and to the electronic circuit 100/300/500. This conductive trace 608 is then coupled through a first via (not shown) and a second via (not shown) of respective interconnected electronic circuits 100/300/500 to a conductive trace 610 contained on the top surface of the PCB 602. The conductive trace 610 is coupled to the integrated circuit 604. In operation, the integrated circuits 604, 606 communicate signals that propagate through the electronic circuits 100/300/500. The signals may be communicated in both directions through the electronic circuits 100/300/500, namely from the integrated circuit 604 to integrated circuit 606 and from integrated circuit 606 to integrated circuit 604. The electronic circuits 100/300/500 have a reduced return loss in the frequency range of interest, and thus signals may be more reliably communicated between the integrated circuits 604, 606. In further embodiments, the integrated circuits 604 and 606 are on different PCBs where the integrated circuit 604 on one PCB is coupled to an electronic circuit 100/300/500 and through a connector to an electronic circuit 100/300/500 coupled to the integrated circuit 606 on another PCB.

As mentioned above, in some embodiments of the present disclosure the first conductor is a first pad on a surface layer of a package and the second conductor is a second pad on a subsurface layer within the package, while the third conductor extending between the first and second conductors is a via as in the embodiments of FIGS. 1-6. In any of the embodiments of FIGS. 1-6, the one or more intermediate conductors 104, 306 and 504 may be non-functional pads. Each of these non-functional pads, along with the first and second conductors and the via are shown as having circular horizontal cross sections in the embodiments of FIGS. 1-6 but are not limited to such circular horizontal cross sections. For example, in further embodiments of the present disclosure, one or both of the first and second conductors is square. Finally, although the electronic circuits of the embodiments of FIGS. 1-6 are described as being implemented in PCBs, embodiments of the present disclosure are not limited to being implemented in PCBs. Further embodiments could be implemented, for example, within the substrate of an integrated circuit or within other substrate structures in which electrical signals are to be communicated between vertically adjacent horizontal conductive layers.

Figure 7:
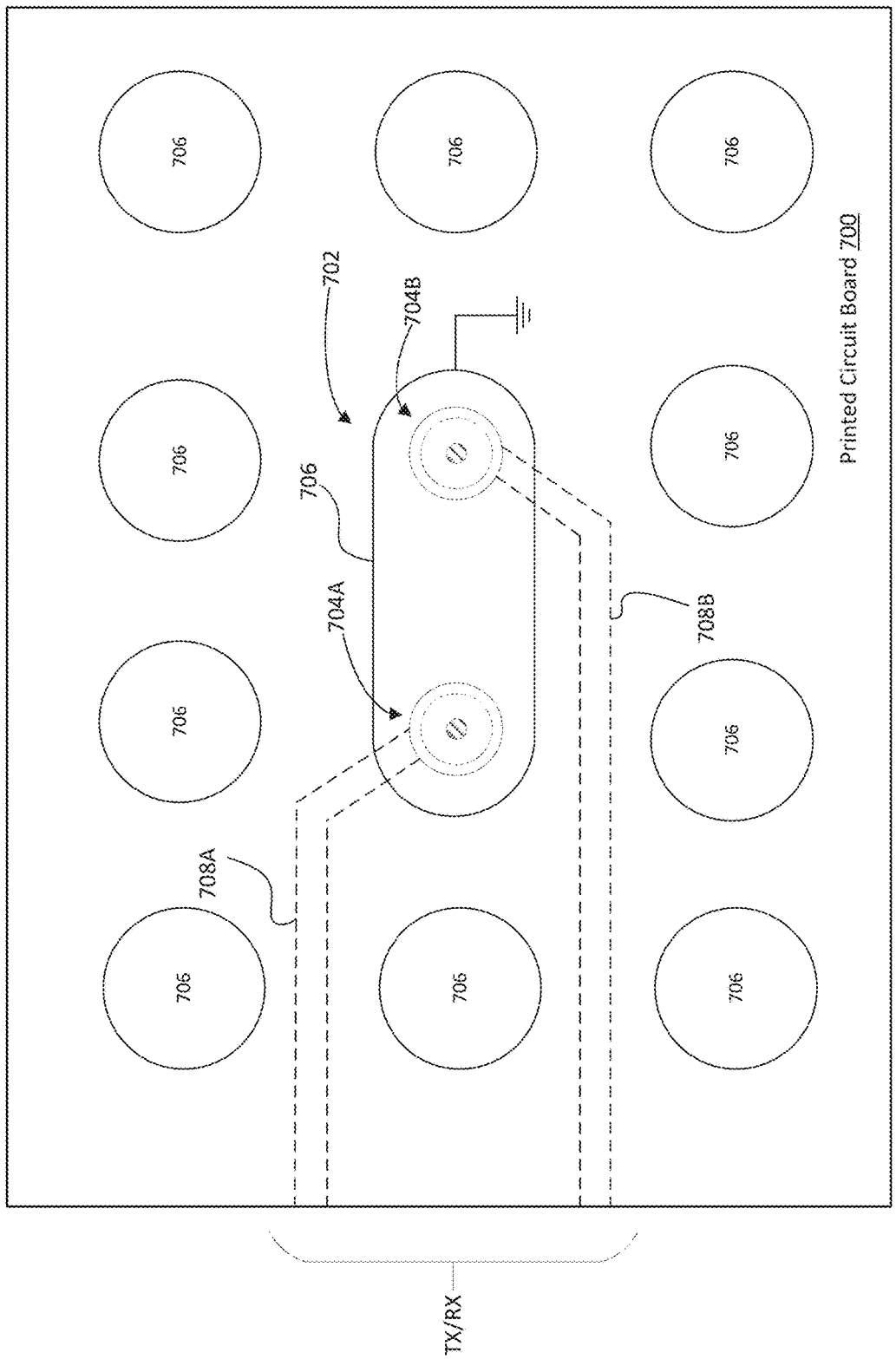
FIG. 7 is top view of a portion of a printed circuit board including a ball grid array package and two vias according to the embodiment of FIG. 3.

FIG. 7 is top view of a portion of a PCB 700 having a BGA package and including an electronic circuit 702 including two electronic sub circuits 704A, 704B, each of which corresponds to the electronic circuit 300 of FIGS. 3 and 4, or the electronic circuit 500 of FIG. 5, except that instead of each sub circuit including a separate ground ring, the electronic circuit 702 includes a single ground ring 706 around the sub circuits 704A, 704B as shown in FIG. 7. A conductive trace 708A on an intermediate layer of the PCB 700 is coupled to the second conductor of the electronic sub circuit 704A, which corresponds to the trace 708A being coupled to the second conductor 310/514 in the embodiments of FIG. 3-5. The second conductor 310/514 is, in turn, coupled through the corresponding via 304/502 to the corresponding first conductor 308/512, which is a conductive pad and solder ball of the BGA package in the embodiment of FIG. 7. Similarly, a conductive trace 708B on an intermediate layer of the PCB 700 is in the same way coupled to the first conductor 308/512, which is a conductive pad and solder ball of the BGA package, of the electronic sub circuit 704B. A plurality of other conductive pads and solder balls 706 of the BGA package on the top layer of the BGA package are shown. A differential signal TX/RX may be transmitted or received over the conductive pad and solder ball of the BGA package of the electronic sub circuits 704A, 704B, with the signals of this differential signal propagating through the electronic sub circuits 704A, 704B of electronic circuit 702 to the conductive traces 708A, 708B on an internal layer of the PCB 700.

FIGS. 8-17 are graphs illustrating return loss and time domain reflectometry (TDR) for conventional signals propagating through conventional vias and through vias having one or more intermediate conductors coupled thereto according to embodiments of the present disclosure. These return loss graphs illustrate the improved performance of vias with intermediate conductors compared to conventional vias at frequency ranges of interest while the TDR graphs illustrate that even though the TDR graphs of vias including intermediate conductors look worse than would be considered desirable for typical impedance tuning of vias, the resulting structures according to embodiments of the present disclosure provide improved performance in frequency ranges of interest.

Figure 8:
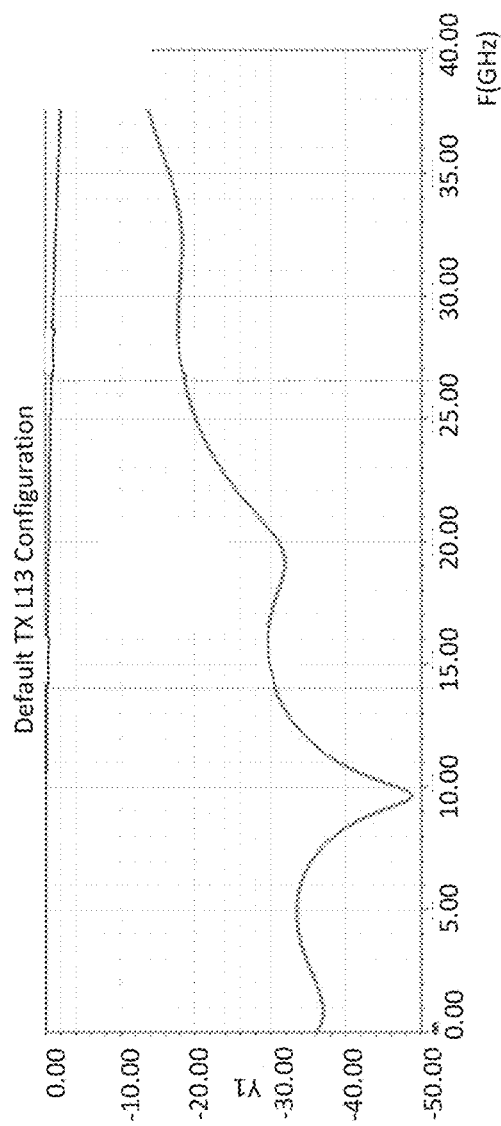
FIG. 8 is a graph illustrating return loss for a via transition in a conventional via including no intermediate conductors.

FIG. 8 is a graph illustrating return loss for a via transition in a conventional via including no intermediate conductors. As previously mentioned, the return loss is the loss of power in a signal that results from a portion of that signal being returned or reflected back towards a source of the signal due to impedance discontinuities in a signal path over which the signal is being communicated. Thus, return loss indicates the amount of energy delivered back to the source of the signal is propagating through the via. Ideally the return loss is as small as possible. Return loss is indicated in the graphs herein in decibels (dB) and all return loss values will be negative. A return loss of −10 dB is lower than −5 dB, for example, and thus a return loss of −10 dB is considered an improvement or is preferred over a −5 dB return loss.

The structure of the PCB 700 of FIG. 7 may be used in generating the graphs of FIGS. 8-17. As seen in FIG. 8, the return loss grooves or dips at frequencies around 10 GHz and 20 GHz. Near 14 GHz the return loss is approximately −30.57 dB while at 26.56 GHz, which is considered in the frequency range of interest, the return loss is significantly greater (about −18.56 dB) than at the 10 GHz and 20 GHz dips. Thus, the conventional via with no intermediate conductors has significant return loss at 26.56 GHz.

In embodiments of the present disclosure, one or more intermediate conductors are coupled to the via to move or shift return loss dips in the return loss graph closer to the frequencies of interest, which is around 26.56 GHz in the examples being described.

Figure 9:
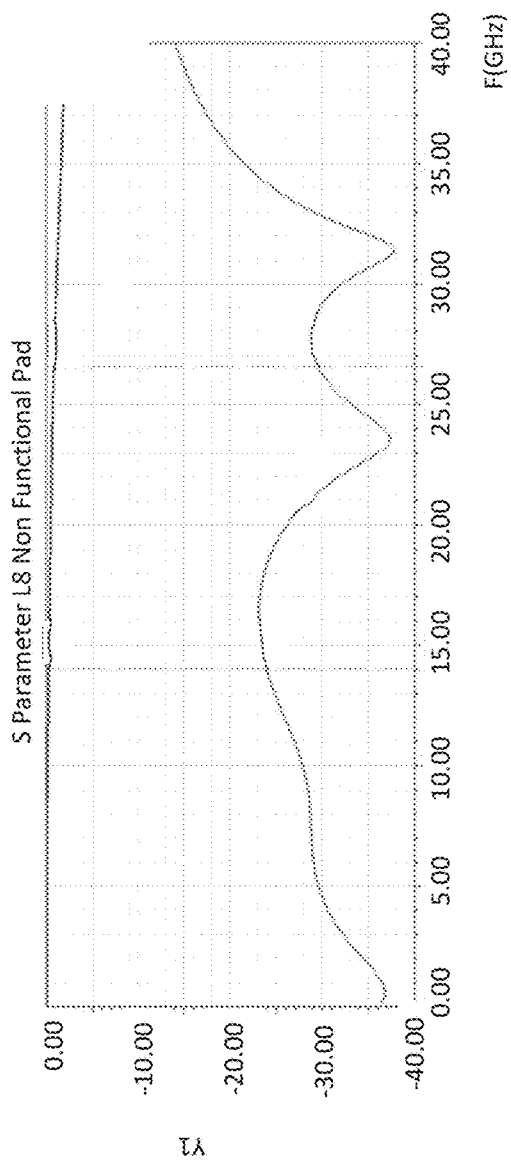
FIG. 9 is a graph illustrating return loss for a via transition in the via of FIG. 3 including a single intermediate conductor according to one embodiment of the present disclosure.

FIG. 9 shows a first example of an electronic circuit according to an embodiment of the present disclosure in which the electronic circuit includes a single intermediate conductor coupled to the via and at least one ground ring surrounding the via as in the embodiment of FIG. 3. As seen in FIG. 9, this addition of a single intermediate conductor along the via such as shown for the intermediate conductor 306 on the via 304 of FIG. 3, along with at least one ground ring 302, shifts the dips in the return loss to higher frequencies and reduces the return loss at 26.56 GHz. The dips in the return loss that were originally at around 10 GHz and 20 GHz as in FIG. 8, are no longer present but instead dips in the return loss appear at around 24 GHz and 31 GHz as shown in FIG. 9. This new location of the dips improves return loss at 26.56 GHz, namely about a 10 dB improvement. FIG. 9 also shows that return loss performance near 14 GHz is worse with the inclusion of the intermediate conductor, but if the frequency range of interest is at 26.56 GHz then the inclusion of the intermediate conductor reduces return loss in this frequency range.

Figure 10:
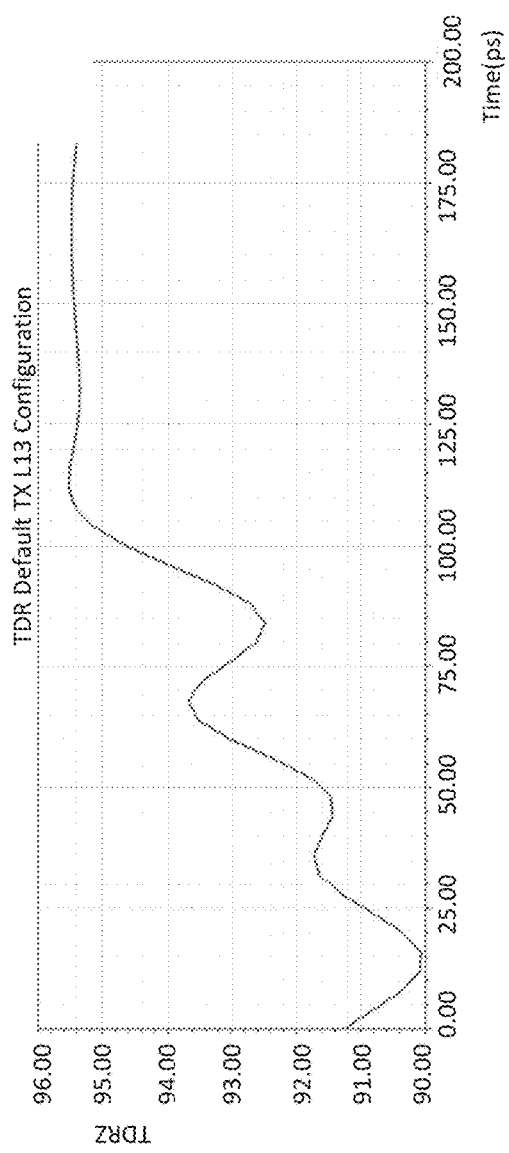
FIG. 10 is a time domain reflectometry (TDR) graph for the same conventional via of FIG. 8 having no intermediate conductors.
Figure 11:
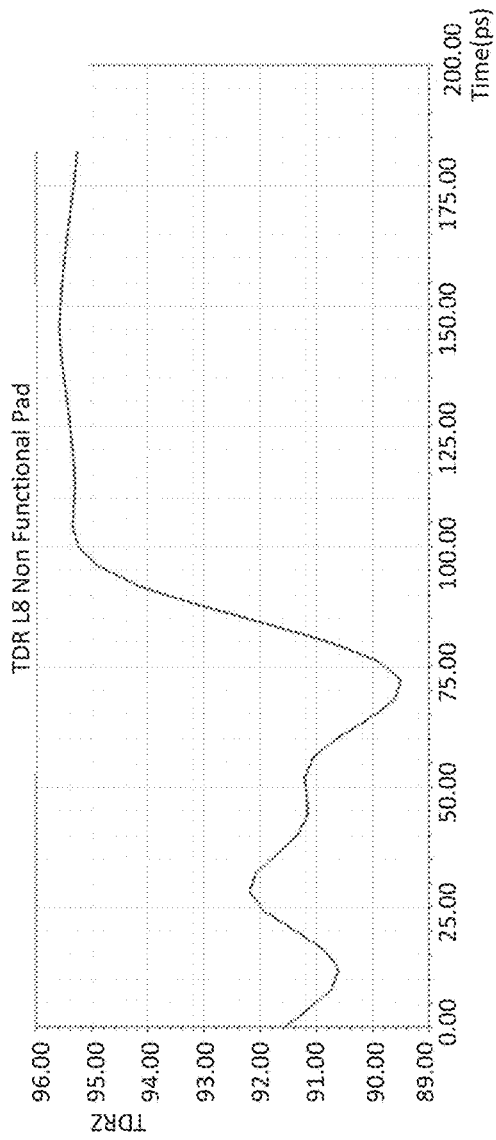
FIG. 11 is a TDR graph for the via of FIG. 3 including the same single intermediate conductor as in FIG. 9.

A unique characteristic of the electronic circuits 100, 300, 500 and other embodiments of the present disclosure feature of our invention is shown through observing TDR graphs of a conventional via including no intermediate conductors and a via including an intermediate conductor. FIG. 10 is a time domain reflectometry (TDR) graph for a conventional via with no intermediate conductors while FIG. 11 is a TDR graph for the electronic circuit 300 of FIG. 3 including a single intermediate conductor 306. In general, the first and second conductors that are coupled through the via each have their own impedances, and to achieve a lower return loss over the largest range possible the impedance of the via is matched as close as possible to the impedances of the first and second conductors. In FIG. 10, the first conductor is a conductive pad and solder ball of a BGA package, and the second conductor is a conductive trace in the PCB. The left side of the TDR graph of FIG. 10 shows ~90 ohms corresponding to the impedance of the conductive trace and the right side of the graphs shows a 95 ohms impedance corresponding to the BGA conductive pad and solder ball impedance. In FIG. 10, the conventional via would be considered well matched if the region of the graph between the right and left sides, which indicates the via impedance, is as closely matched to 90 and 95 ohms as possible and lies at some values between these two values.

Referring to the TDR graph of FIG. 11, however, which corresponds to the TDR plot for the electronic circuit 300 of FIG. 3 with one intermediate conductor 306, the TDR graph looks worse in that a dip in impedance of the via below the 90 ohm impedance of the conductive trace occurs. Notwithstanding the impedance of the via 306 being worse from the perspective of trying to match the impedance of the via on both sides to the conductive trace and conductive pad and solder ball of the BGA package, the lower return loss for the electronic circuit 300 as discussed with reference to FIG. 9 is realized near the frequency range of interest, which is around 26.5625 GHz in the examples being described.

Figure 12:
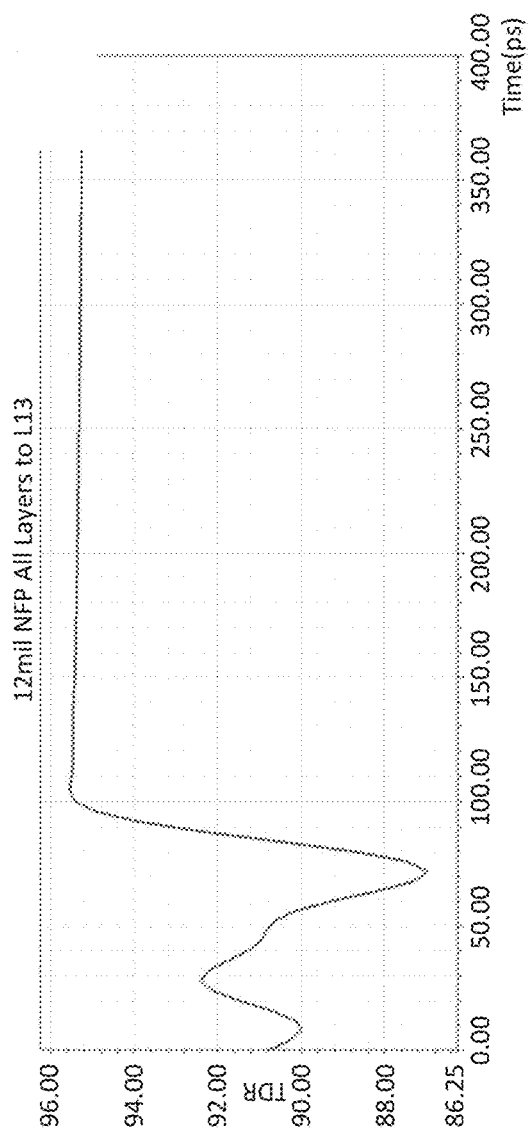
FIG. 12 is a TDR graph for the via of FIG. 3 including multiple intermediate conductors according to another embodiment.
Figure 13:
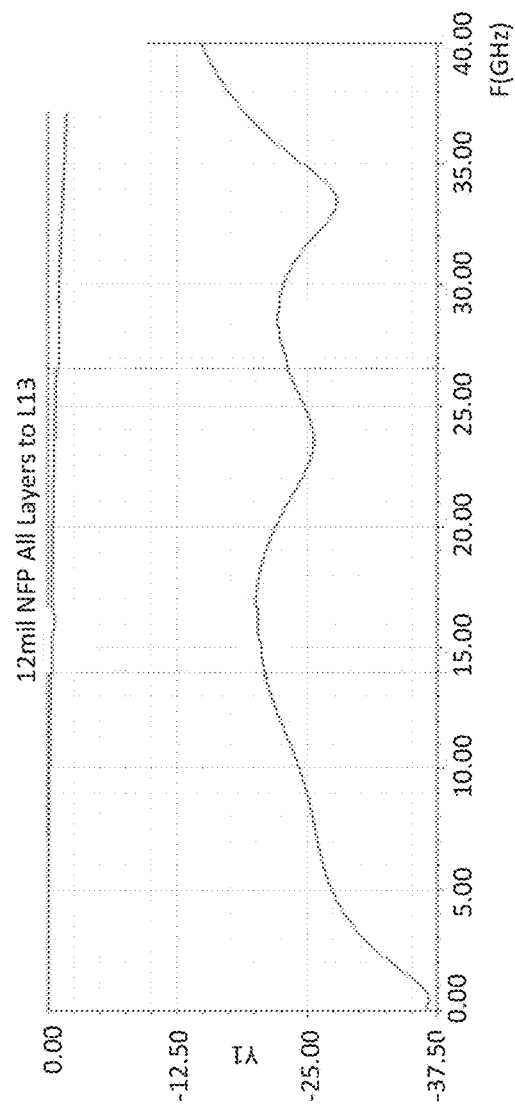
FIG. 13 is a graph illustrating return loss for the via of the example of FIG. 12 including multiple intermediate conductors.

FIG. 12 illustrates another more extreme case of the impedance of the via 304 being lower than the 90 ohms of the second conductor 310 but the performance of the electronic circuit 300 still improving at the frequency range of interest at around 26.56 GHz. In the example of FIG. 12, multiple intermediate conductors 306 are placed on every layer in the PCB 106 between the first and second conductors 308, 310. In this situation, the impedance of the via goes to around 87 ohms but as seen in FIG. 13 the return loss for this configuration of the electronic circuit 300 still has an improved return loss at 26.56 GHz compared to the original via configuration (FIG. 8) with no intermediate conductors 304.

Figure 14:
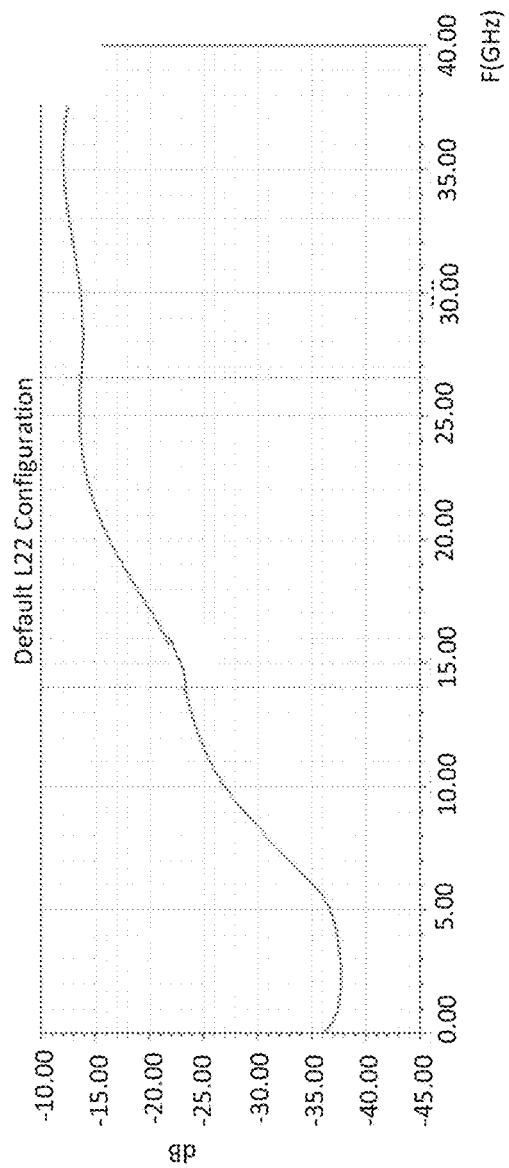
FIG. 14 is a graph illustrating return loss for a via transition in a conventional via including no intermediate conductors and with a trace on a different layer than the example of FIG. 7.
Figure 15:
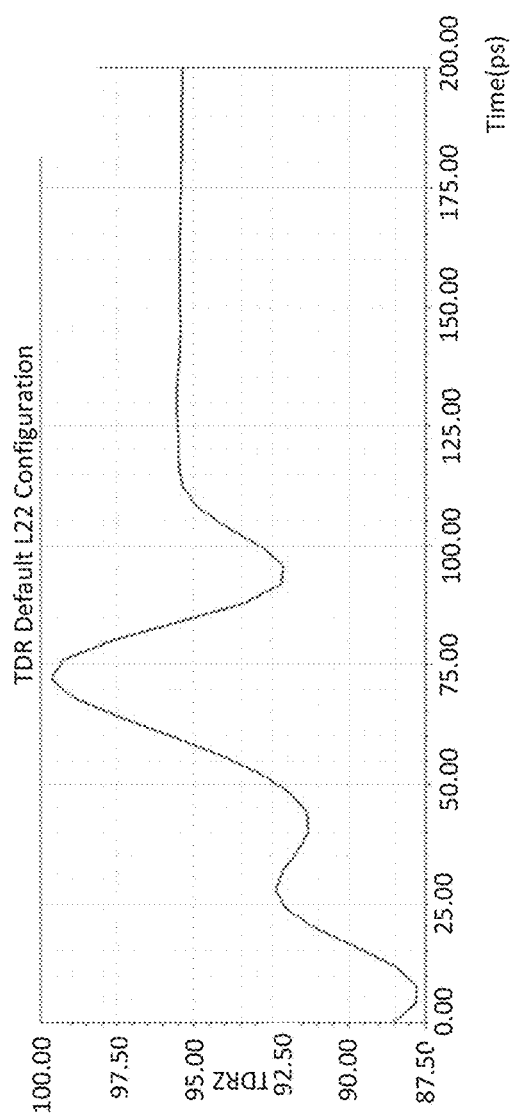
FIG. 15 is a TDR graph for the via in the example of FIG. 14.

FIG. 14 is a graph illustrating return loss for a via transition in a conventional via including no intermediate conductors and with a conductive trace on a different layer in the PCB than in the example of FIG. 8. In a printed circuit board, signals propagating through a via from different layers in the PCB have a different impedance profiles and so may require different configurations for the intermediate conductors along the via. FIG. 14 illustrates a return loss graph for a signal propagating through the via 102 (FIG. 1) from a different layer in the PCB 106 than in the example return loss graph of FIG. 8. FIG. 14 illustrates the return loss for such a structure with no intermediate conductors coupled to the via. The return loss is −23.27 dB at 14GHz and the −13.69 dB at 26.56GHz, and no meaningful dips in the return loss are visible. FIG. 15 is a corresponding TDR graph for the via structure in the example of FIG. 14.

Figure 16:
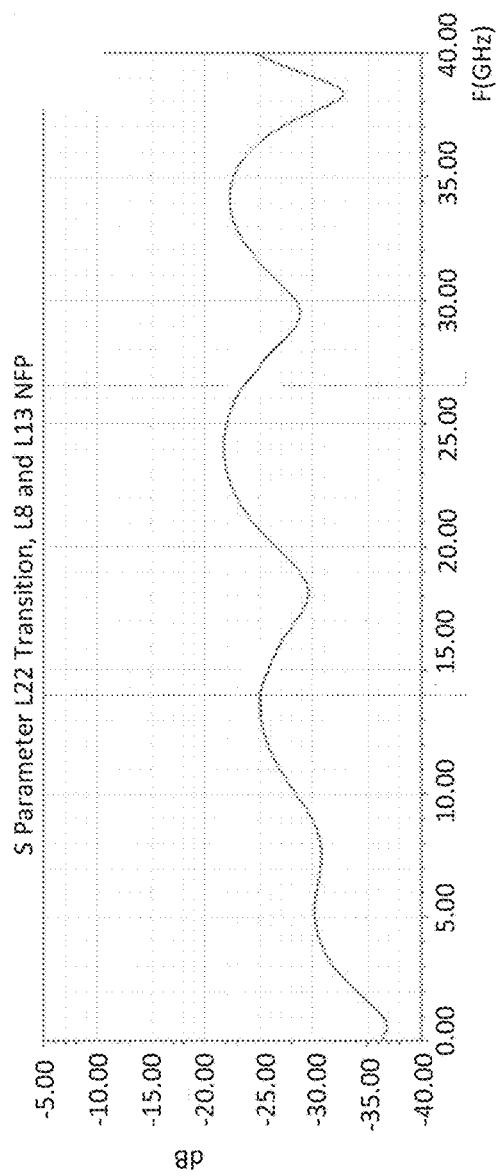
FIG. 16 is a graph illustrating return loss for the via of FIG. 1 including two intermediate conductors and with the trace on a different layer as in the example of FIG. 14 according to an embodiment.
Figure 17:
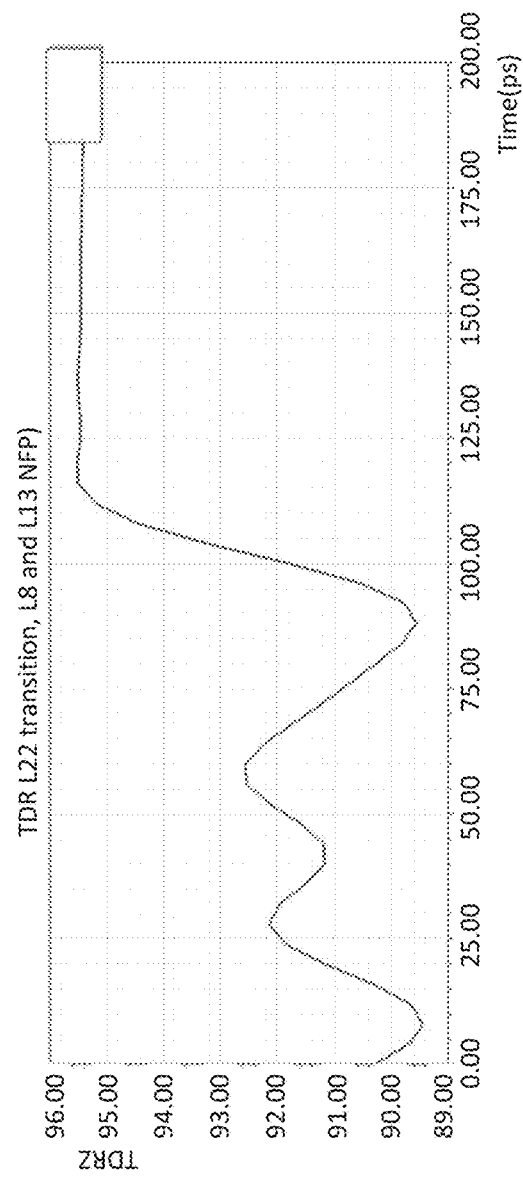
FIG. 17 is a TDR graph for the via in the example of FIG. 16.

FIG. 16 is a graph illustrating return loss the electronic circuit 100 of FIG. 1 where two intermediate conductors 104 are coupled to the via 102 and FIG. 17 is a TDR graph for the electronic circuit having the same structure that for FIG. 16. As seen in FIG. 16, the inclusion of the two intermediate conductors 104 results in multiple dips in the return loss for the electronic circuit 100. Two of these dips occur in the vicinity of the frequency range of interest around 26.56 GHz and result in an improved return loss of 10 dB compared to the conventional structure of FIG. 14. The TDR graph of FIG. 17 shows that once again the impedance of the via 102 dips below the 90 ohm impedance of the conductive trace (second conductor 110) but the return loss is nonetheless improved as seen in FIG. 16.

Figure 19:
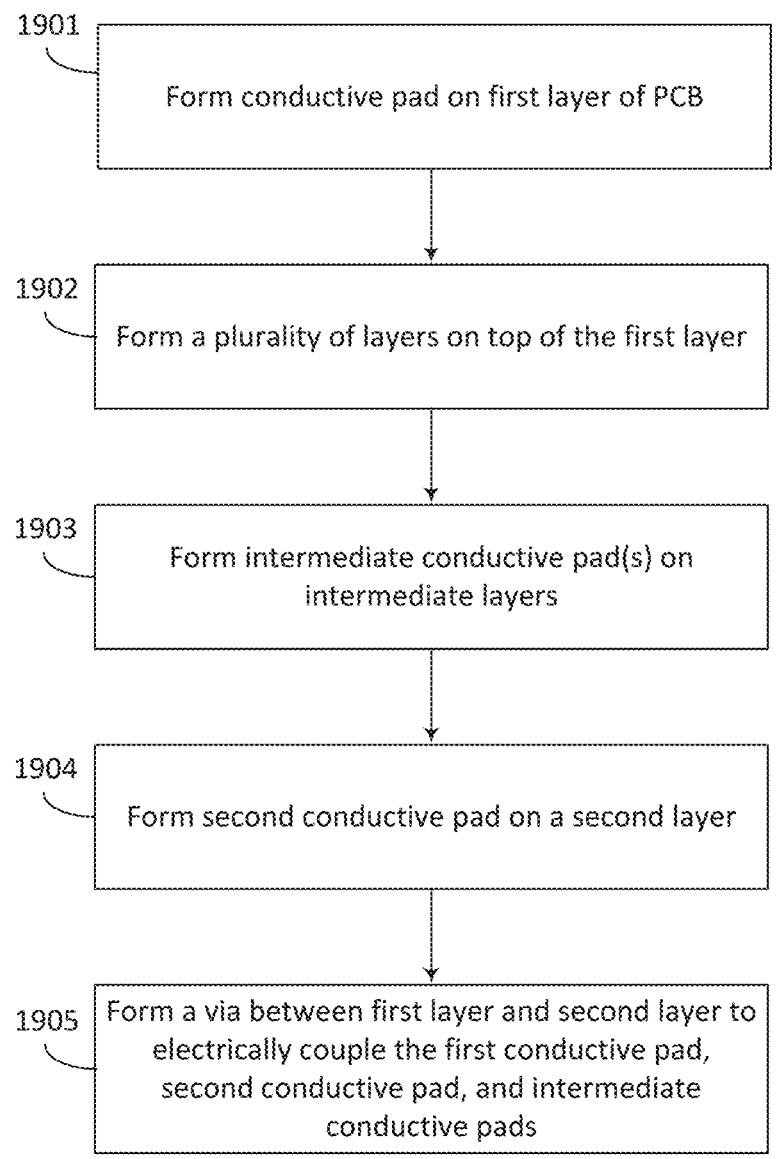
FIG. 19 illustrates a method of manufacturing according to an embodiment.

FIG. 19 illustrates a method of manufacturing an electronic circuit according to an embodiment. At 1901, a first conductive pad is formed on a first layer of a printed circuit board (PCB). In one embodiment, a conductive trace is formed that is electrically coupled to the first conductive pad. At 1902, a plurality of intermediate layers are formed on top of the first layer. One or more of the intermediate layers may have formed thereon one or more intermediate conductive pads as illustrated at 1903. In some example embodiments, the one or more intermediate conductive pads may only be electrically coupled to the via. At 1904, a second conductive pad is formed on a second layer of the PCB (e.g., above the first layer). At 1905, a via is formed between the first layer and the second layer to electrically couple the first conductive pad, the second conductive pad, and the one or more intermediate conductive pads.

FURTHER EXAMPLE EMBODIMENTS

Various example embodiments are described below. The following examples may be taken alone or in combination with the other examples below.

One example embodiment of the present disclosure includes an electronic circuit comprising: a first conductor configured horizontally on a first layer; a second conductor configured horizontally on a second layer, wherein the second conductor is separated from the first conductor by a plurality of layers; a third conductor configured between the first layer and the second layer, the third conductor electrically coupling the first conductor and the second conductor; and one or more intermediate conductors electrically coupled to the third conductor, the intermediate conductors configured on one or more intermediate layers between the first layer and the second layer.

In one embodiment, the second conductor is vertically below the first conductor.

In one embodiment, the third conductor is configured vertically between the first layer and the second layer.

In one embodiment, the intermediate conductors are configured horizontally on one or more intermediate layers between the first layer and the second layer.

In one embodiment, the one or more intermediate conductors reduce a return loss of a signal coupled to one of the first conductor or the second conductor across a first range of frequencies.

In one embodiment, the one or more intermediate conductors increase a capacitance along the third conductor between the first conductor and second conductor.

In one embodiment, second conductor is coupled to an electrical trace to receive a signal and the one or more intermediate conductors are electrically coupled only to the third conductor.

In one embodiment, the one or more intermediate conductors are configured along the third conductor between the first conductor and second conductor at intervals based at least on a horizontal cross-sectional area of the first conductor, the second conductor, and the third conductor.

In one embodiment, the electronic circuit further comprises a plurality of conductors coupled to a reference voltage, wherein conductors of the plurality of conductors are on the same layer as, and spaced apart from, the first conductor on the first layer, the second conductor on the second layer, and the third conductor on a plurality of layers between the first layer and the second layer.

In one embodiment, the plurality of conductors are on the same layer as, and spaced apart from, at least one of the one or more intermediate conductors.

In one embodiment, the plurality of conductors are on vertically adjacent layers as, and spaced apart from, at least one of the one or more intermediate conductors.

In one embodiment, the plurality of conductors are horizontally adjacent to, and spaced apart from, at least one of the one or more intermediate conductors.

In one embodiment, the plurality of conductors form a ground ring around the first conductor, the second conductor, the third conductor, and the one or more intermediate conductors.

In one embodiment, the one or more intermediate conductors are configured along the third conductor between the first conductor and second conductor at intervals based at least on distances between the conductors of the plurality of conductors and the first conductor on the first layer, the second conductor on the second layer, and the one or more intermediate conductors.

In one embodiment, first conductor is a first pad on a surface layer, the second conductor is a second pad on a subsurface layer, and the third conductor is a via.

In one embodiment, the one or more intermediate conductors are non-functional pads.

In one embodiment, at least one of the first pad or second pad are circular.

In one embodiment, at least one of the first pad or second pad are square.

In one embodiment, the via is cylindrical.

In one embodiment, the first layer, the second layer, and the plurality of layers are layers of a printed circuit board.

In another embodiment, the present disclosure includes an electronic circuit comprising: a first conductive pad configured on a first layer of a printed circuit board; a second conductive pad configured on a second layer of the printed circuit board, wherein the second conductive pad is separated from the first conductive pad by a plurality of layers; a via configured between the first layer and the second layer, the via electrically coupling the first conductive pad and the second conductive pad; and one or more intermediate conductive pads electrically coupled to the via, the intermediate conductive pads configured on one or more intermediate layers between the first conductive pad on the first layer and the second conductive pad on the second layer.

In another embodiment, the present disclosure includes an electronic system comprising: a plurality of integrated circuits; and one or more circuit boards, at least one circuit board comprising: a first conductive pad configured on a first layer of a printed circuit board; a second conductive pad configured on a second layer of the printed circuit board, wherein the second conductive pad is separated from the first conductive pad by a plurality of layers; a via configured between the first layer and the second layer, the via electrically coupling the first conductive pad and the second conductive pad; and one or more intermediate conductive pads electrically coupled to the via, the intermediate conductive pads configured on one or more intermediate layers between the first conductive pad on the first layer and the second conductive pad on the second layer.

In another embodiment, the present disclosure includes an electronic circuit comprising: a first conductive pad configured on a first layer of a printed circuit board; a second conductive pad configured on a second layer of the printed circuit board, wherein the second conductive pad is separated from the first conductive pad by a plurality of layers; a via configured between the first layer and the second layer, the via electrically coupling the first conductive pad and the second conductive pad; and means for increasing a capacitance along the via between the first conductive pad and second conductive pad to reduce a return loss of a signal coupled to one of the first conductive pad or the second conductive pad across a first range of frequencies.

In another embodiment, the present disclosure includes method of manufacturing an electronic circuit comprising: forming a first conductive pad on a first layer of a printed circuit board; forming a plurality of layers on top of the first layer, wherein one or more of the plurality of layers comprise one or more intermediate conductive pads; forming a second conductive pad on a second layer of the printed circuit board; and forming a via between first layer and second layer to electrically couple the first conductive pad, the second conductive pad, and the one or more intermediate conductive pads.

In one embodiment, the method of manufacturing further comprises forming a conductive trace electrically coupled to the first conductive pad, wherein the one or more intermediate conductive pads are electrically coupled only to the via.

The above description illustrates various embodiments of the present disclosure along with examples of how aspects of the particular embodiments may be implemented. The above examples should not be deemed to be the only embodiments, and are presented to illustrate the flexibility and advantages of the particular embodiments as defined by the following claims. Based on the above disclosure and the following claims, other arrangements, embodiments, implementations and equivalents may be employed without departing from the scope of the present disclosure as defined by the claims.

What is claimed is:

1. An electronic circuit comprising:
   a first conductor configured horizontally on a first layer;
   a second conductor configured horizontally on a second layer, wherein the second conductor is separated from the first conductor by a plurality of layers;
   a third conductor configured between the first layer and the second layer, the third conductor electrically coupling the first conductor and the second conductor;
   one or more intermediate conductors electrically coupled to the third conductor, the intermediate conductors configured on one or more intermediate layers between the first layer and the second layer;
   a plurality of conductors coupled to a reference voltage, wherein conductors of the plurality of conductors are on the same layer as, and spaced apart from, the first conductor on the first layer, the second conductor on the second layer, and the third conductor on a plurality of the intermediate layers between the first layer and the second layer, wherein the plurality of conductors form a ground ring around the first conductor, the second conductor, the third conductor, and the one or more intermediate conductors.

2. The electronic circuit of claim 1 wherein the second conductor is vertically below the first conductor.

3. The electronic circuit of claim 1 wherein the third conductor is configured vertically between the first layer and the second layer.

4. The electronic circuit of claim 1 wherein the intermediate conductors are configured horizontally on one or more intermediate layers between the first layer and the second layer.

5. The electronic circuit of claim 1 wherein the one or more intermediate conductors reduce a return loss of a signal coupled to one of the first conductor or the second conductor across a first range of frequencies.

6. The electronic circuit of claim 1 wherein the one or more intermediate conductors increase a capacitance along the third conductor between the first conductor and second conductor.

7. The electronic circuit of claim 1 wherein second conductor is coupled to an electrical trace to receive a signal and the one or more intermediate conductors are electrically coupled only to the third conductor.

8. The electronic circuit of claim 1 wherein the one or more intermediate conductors are configured along the third conductor between the first conductor and second conductor at intervals based at least on a horizontal cross-sectional area of the first conductor, the second conductor, and the third conductor.

9. The electronic circuit of claim 1, wherein the plurality of conductors are horizontally adjacent to, and spaced apart from, at least one of the one or more intermediate conductors.

10. The electronic circuit of claim 1, wherein the one or more intermediate conductors are configured along the third conductor between the first conductor and second conductor at intervals based at least on distances between the conductors of the plurality of conductors and the first conductor on the first layer, the second conductor on the second layer, and the one or more intermediate conductors.

11. The electronic circuit of claim 1 wherein first conductor is a first pad on a surface layer, the second conductor is a second pad on a subsurface layer, and the third conductor is a via.

12. The electronic circuit of claim 11 wherein the one or more intermediate conductors are non-functional pads.

13. The electronic circuit of claim 11 wherein at least one of the first pad or second pad are circular.

14. The electronic circuit of claim 11 wherein at least one of the first pad or second pad are square.

15. The electronic circuit of claim 11 wherein the via is cylindrical.

16. The electronic circuit of claim 1 wherein the first layer, the second layer, and the plurality of layers are layers of a printed circuit board.

17. An electronic circuit comprising:
a first conductive pad configured on a first layer of a printed circuit board;
a second conductive pad configured on a second layer of the printed circuit board, wherein the second conductive pad is separated from the first conductive pad by a plurality of layers;
a via configured between the first layer and the second layer, the via electrically coupling the first conductive pad and the second conductive pad;
one or more intermediate conductive pads electrically coupled to the via, the intermediate conductive pads configured on one or more intermediate layers between the first conductive pad on the first layer and the second conductive pad on the second layer; and
a plurality of conductors coupled to a reference voltage, wherein conductors of the plurality of conductors are on the same layer as, and spaced apart from, the first conductive pad on the first layer and the second conductive pad on the second layer, and wherein conductors of the plurality of conductors are spaced apart from the via on a plurality of the intermediate layers and are on the same intermediate layer as, and spaced apart from, at least one of the one or more intermediate conductive pads.

18. The electronic circuit of claim 17 wherein the one or more intermediate conductive pads are non-functional pads.

19. The electronic circuit of claim 17 wherein the one or more intermediate conductive pads are configured along the via between the first conductive pad and second conductive pad at intervals based at least on a horizontal cross-sectional area of the first conductive pad, the second conductive pad, and the via.

20. An electronic system comprising:
a plurality of integrated circuits; and
one or more circuit boards, at least one circuit board comprising:
a first conductive pad configured on a first layer of a printed circuit board;
a second conductive pad configured on a second layer of the printed circuit board, wherein the second conductive pad is separated from the first conductive pad by a plurality of intermediate layers between the first layer and the second layer;
a via configured on the plurality of the intermediate layers between the first layer and the second layer, the via electrically coupling the first conductive pad and the second conductive pad; and
one or more intermediate conductive pads electrically coupled to the via, the intermediate conductive pads configured on one or more of the intermediate layers between the first conductive pad on the first layer and the second conductive pad on the second layer; and
a plurality of conductors coupled to a reference voltage, wherein conductors of the plurality of conductors are on the first layer, the second layer, and the plurality of the intermediate layers between the first layer and the second layer, and spaced apart from, the first conductive pad, the second conductive pad, and the via; and wherein conductors of the plurality of conductors are on vertically adjacent intermediate layers to, and spaced apart from, at least one of the intermediate conductive pads.

21. The electronic circuit of claim 20 wherein the one or more intermediate conductive pads are non-functional pads.

22. An electronic circuit comprising:
a first conductive pad configured on a first layer of a printed circuit board;
a second conductive pad configured on a second layer of the printed circuit board, wherein the second conductive pad is separated vertically from the first conductive pad by a plurality of layers and is separated horizontally on the second layer from the first conductive pad on the first layer, wherein the second conductive pad does not overlap the first conductive pad;
a via configured between the first layer and the second layer, the via electrically coupling the first conductive pad and the second conductive pad;
means for increasing a capacitance along the via between the first conductive pad and second conductive pad to reduce a return loss of a signal coupled to one of the first conductive pad or the second conductive pad across a first range of frequencies.

23. A method of manufacturing an electronic circuit comprising:
forming a first conductive pad on a first layer of a printed circuit board;
forming a plurality of layers on top of the first layer, wherein one or more of the plurality of layers comprise one or more intermediate conductive pads;
forming a second conductive pad on a second layer of the printed circuit board;
forming a via between first layer and second layer to electrically couple the first conductive pad, the second conductive pad, and the one or more intermediate conductive pads;
forming a first plurality of conductors on the same layer as, and spaced apart from, the first conductive pad on the first layer and the second conductive pad on the second layer;
forming a second plurality of conductors on the plurality of layers on top of the first layer, wherein the second plurality of conductors are formed on vertically adjacent layers to, and spaced apart from, at least one of the one or more intermediate conductive pads, and wherein the second plurality of conductors are formed on the same layer as, and spaced apart from, the via on the plurality of layers between the first layer and the second layer, and at least one of the one or more intermediate conductive pads; and
coupling the first plurality of conductors and the second plurality of conductors to a reference voltage.

24. The method of manufacturing of claim 23 further comprising forming a conductive trace electrically coupled to the first conductive pad, wherein the one or more intermediate conductive pads are electrically coupled only to the via.

* * * * *